(12) United States Patent
Ahmad et al.

(10) Patent No.: US 11,294,009 B2
(45) Date of Patent: Apr. 5, 2022

(54) CARTESIAN SAMPLING FOR DYNAMIC MAGNETIC RESONANCE IMAGING (MRI)

(71) Applicants: Ohio State Innovation Foundation, Columbus, OH (US); Siemens Healthcare GmbH, Erlangen (DE)

(72) Inventors: Rizwan Ahmad, Columbs, OH (US); Ning Jin, Powell, OH (US); Orlando Simonetti, Columbus, OH (US); Yingmin Liu, Columbus, OH (US); Adam Rich, Columbus, OH (US)

(73) Assignees: Ohio State Innovation Foundation, Columbus, OH (US); Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/984,351

(22) Filed: Aug. 4, 2020

(65) Prior Publication Data

US 2021/0033689 A1 Feb. 4, 2021

Related U.S. Application Data

(60) Provisional application No. 62/882,567, filed on Aug. 4, 2019.

(51) Int. Cl.

| | |
|---|---|
| *G01V 3/00* | (2006.01) |
| *G01R 33/48* | (2006.01) |
| *G01R 33/561* | (2006.01) |
| *G01R 33/54* | (2006.01) |
| *G01R 33/56* | (2006.01) |

(52) U.S. Cl.
CPC ......... *G01R 33/482* (2013.01); *G01R 33/543* (2013.01); *G01R 33/5608* (2013.01); *G01R 33/5619* (2013.01)

(58) Field of Classification Search
CPC .............. G01R 33/543; G01R 33/5659; G01R 33/3415; G01R 33/36; A61B 5/055
USPC ........................................................ 324/309
See application file for complete search history.

(56) References Cited

U.S. PATENT DOCUMENTS

| | | | |
|---|---|---|---|
| 2007/0097261 A1* | 5/2007 | Smith .................. | H04N 7/0122 348/445 |
| 2011/0044546 A1* | 2/2011 | Pan ....................... | G06T 11/005 382/195 |
| 2015/0265220 A1* | 9/2015 | Ernst ....................... | G06T 7/292 600/411 |
| 2017/0169564 A1* | 6/2017 | Hansen ............ | G01R 33/56341 |

\* cited by examiner

Primary Examiner — Walter L Lindsay, Jr.
Assistant Examiner — Frederick Wenderoth
(74) *Attorney, Agent, or Firm* — Meunier Carlin & Curfman LLC

(57) ABSTRACT

A variable density Cartesian sampling method that allows retrospective adjustment of temporal resolution, providing added flexibility for real-time applications where optimal temporal resolution may not be known in advance. The methods provide for a computationally efficient sampling methods where a first step includes producing a uniformly random sampling pattern using a golden ratio on a grid, and the second step is applying a nonlinear stretching operation to create a variable density sampling pattern. Diagnostic quality images may be recovered at different temporal resolutions.

28 Claims, 16 Drawing Sheets

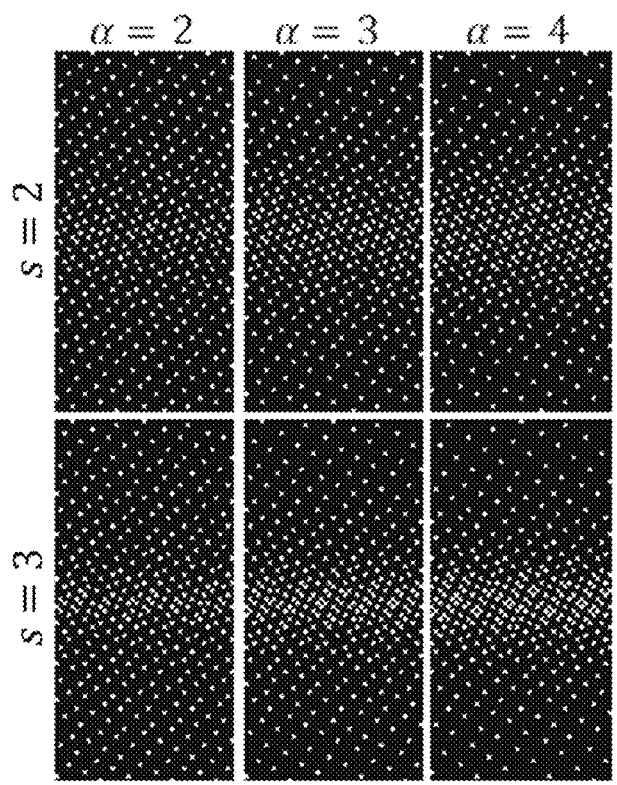
FIG. 8A
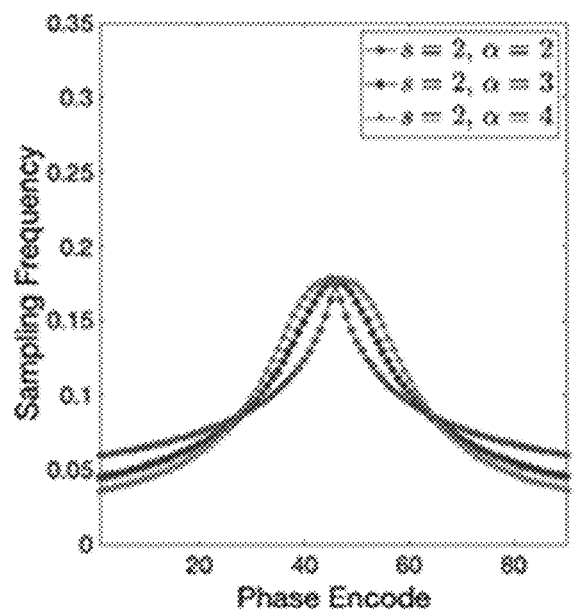 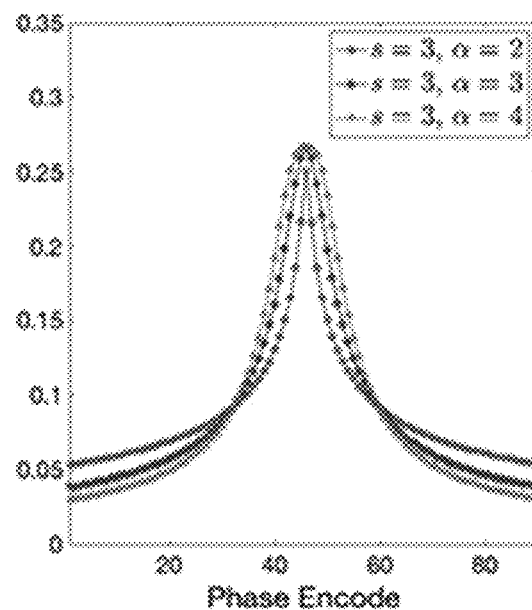
FIG. 8B          FIG. 8C

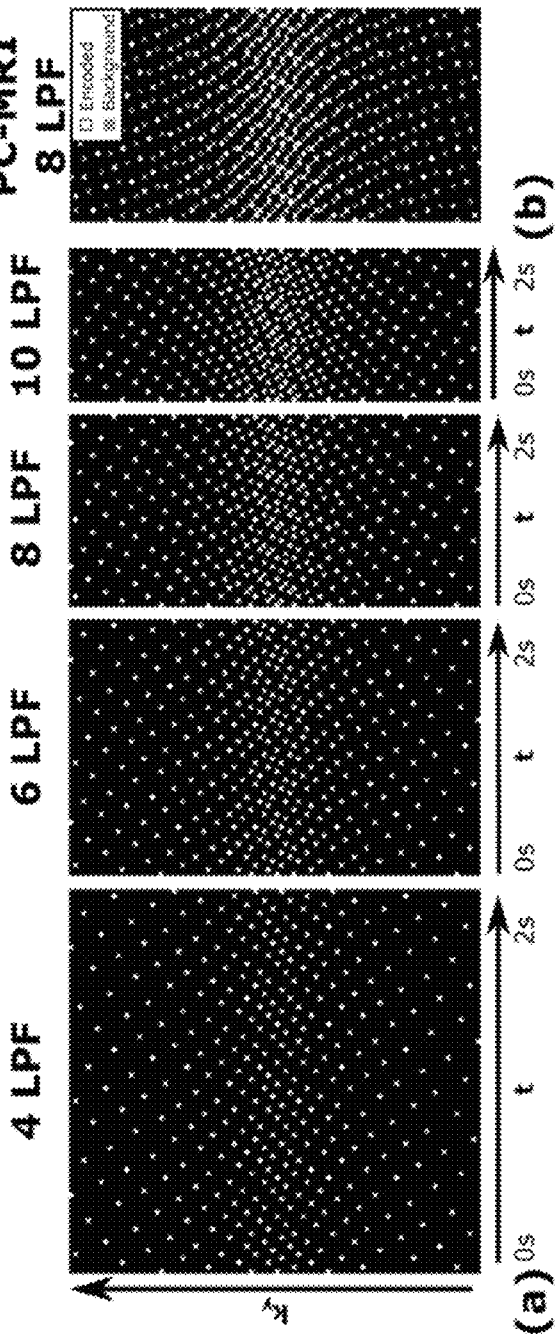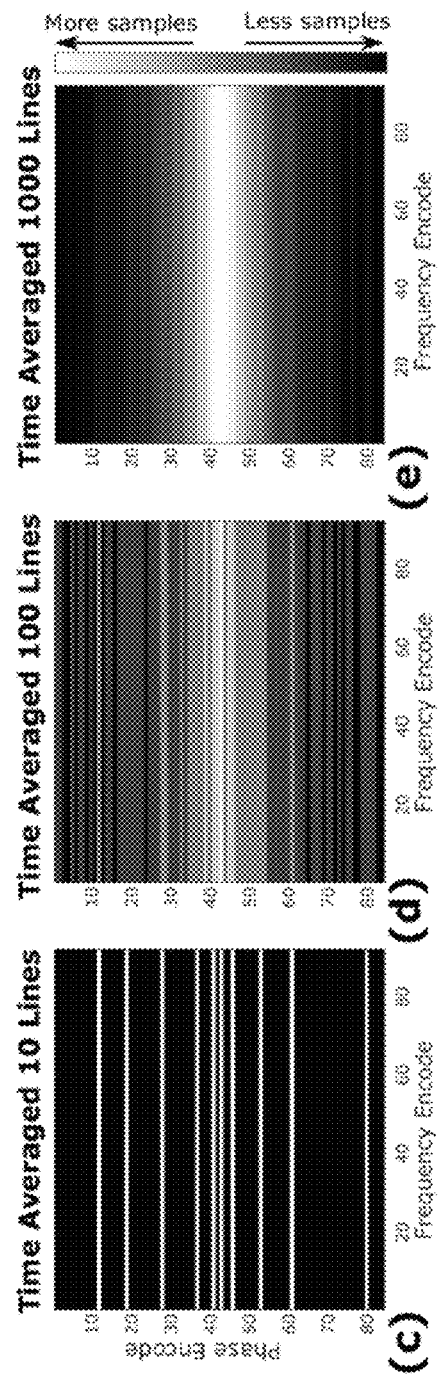

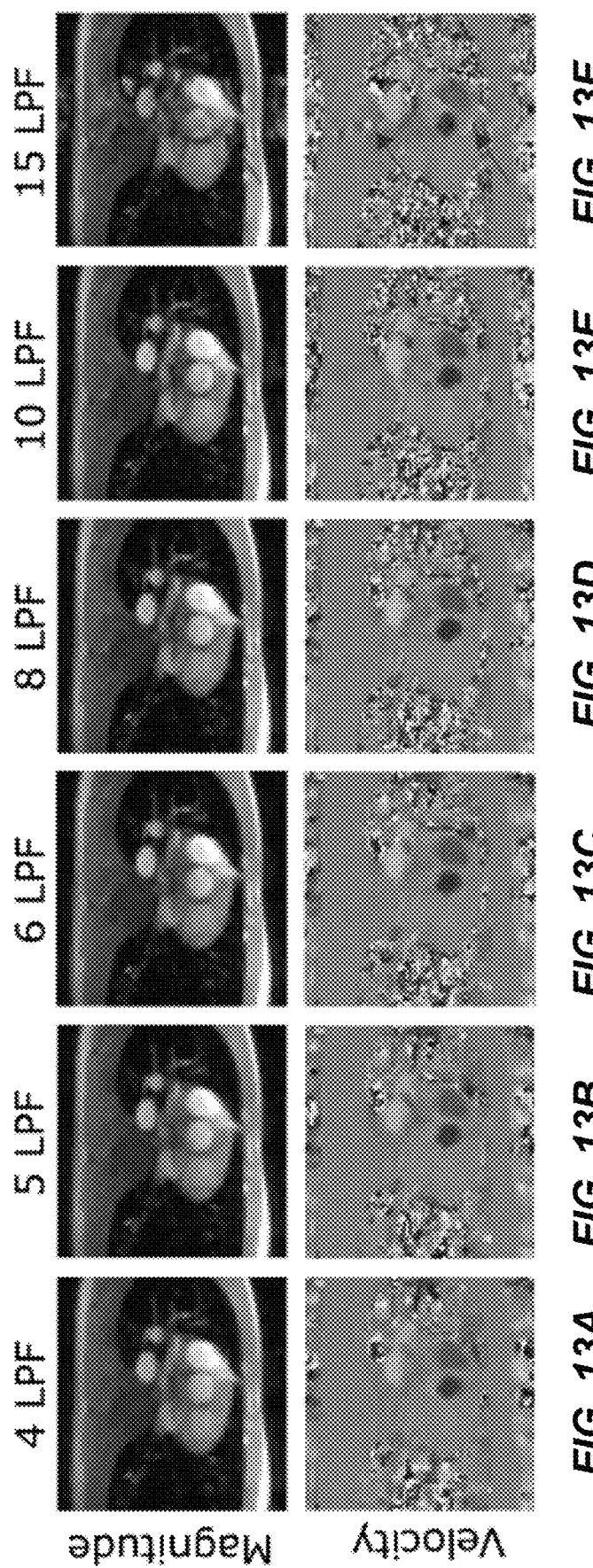

CARTESIAN SAMPLING FOR DYNAMIC MAGNETIC RESONANCE IMAGING (MRI)

CROSS-REFERENCE TO RELATED APPLICATION

This application claims priority to U.S. Provisional Patent Application No. 62/882,567, filed Aug. 4, 2019 and entitled "CARTESIAN SAMPLING FOR DYNAMIC MAGNETIC RESONANCE IMAGING (MRI)," which is incorporated herein by reference in its entirety.

FIELD OF THE INVENTION

The present invention relates to magnetic resonance imaging (MRI) and more specifically to techniques for cartesian data sampling.

BACKGROUND

Cardiac MRI (CMR) is a powerful tool to assess a wide range of cardiac conditions. A typical CMR exam would include several breath-held segmented images acquired using Cartesian sampling. However, breath-hold segmented imaging has several limitations. First, patients with cardiovascular problems can have severely limited capability to hold their breath. Second, segmented imaging uses data acquired from multiple heartbeats to reconstruct a single heart cycle. This can lead to artifacts in patients with arrhythmia or other irregularities. Finally, the temporal resolution of the scan must be chosen in advance and cannot be altered after acquisition.

Real-time, free-breathing CMR can overcome limitations from patient breath-hold capacity and arrhythmias. However, to acquire data with sufficient temporal resolution, real-time CMR data acquisition must be highly accelerated. Regularized reconstruction methods, such as compressed sensing (CS), with Cartesian or non-Cartesian acquisition have been successfully applied to accelerate real-time CMR. Although Cartesian acquisition remains the most commonly utilized acquisition scheme in clinic due to its robustness to system imperfections and a long track record of success, Golden-Angle Radial Sampling (GARS) has gained popularity more recently. Two key advantages of GARS are its ability to preferentially sample the central k-space and to maintain sampling uniformity across different time scales, which allows retrospective adjustment of temporal resolution. Although it is feasible to create a Cartesian acquisition based on an increment of phase-encoding index by Golden Ratio offset (GRO), the resulting sampling pattern would lack the variable density. Considering that most the signal energy resides in the central k-space, high acceleration is not feasible without preferential sampling the central region of k-space.

Thus, there is a need for acquisition and processing methods to image blood flow and tissue stiffness from a single dataset (i.e., from a single acquisition). Use of these methods may offer a plurality of advantages, including, but not limited to (i) reduced scan time, (ii) automatic registration of datasets, (iii) reduced susceptibility to physiological changes, (iv) eased breath-hold requirements, and (v) complementary information for improved understanding/diagnosis.

Yet further, for an effective application of CS, which exploits the underlying compressibility of an image, one of the requirements for the under-sampling artifact is to be incoherent (noise-like) in the sparsifying transform domain. Several random and pseudo-random sampling methods have been proposed that yield a high level of incoherency. For dynamic applications, Variable density Incoherent SpatioTemporal Acquisition (VISTA) may be used as VISTA offers many advantages over other pseudo-random Cartesian sampling methods, including (i) incorporating variable density, (ii) ensuring that the time-averaged data is fully sampled, and (iii) limiting eddy currents by controlling the extent of jumps (in k-space) from one readout to the next. However, computation of VISTA, is slow and requires pre-computed look-up tables. Thus, there is a further need for a sampling method, which, in addition to offering the above-mentioned benefits of VISTA, is computationally efficient.

SUMMARY

Accordingly, the present disclosure discloses a method for CArtesian sampling with Variable density and Adjustable temporal resolution (CAVA). The method includes creating a uniformly random sampling pattern on a first smaller grid with Ns phase-encoding (PE) lines; for each frame, circularly rotating the uniformly random sampling pattern for a previous frame; repeating the creating and circularly rotating for all frames; projecting samples from the first grid to a second larger grid using a nonlinear stretching function; reconstructing diagnostic quality images from the second grid with N PE lines; and visually presenting the diagnostic quality images.

In accordance with aspects of the disclosure, an MRI apparatus is disclosed that performs the method for CArtesian sampling with Variable density and Adjustable temporal resolution (CAVA).

In accordance with other aspects of the disclosure, a method for Golden-shift Ordered Cartesian (GOC) sampling is disclosed that includes creating a uniformly random sampling pattern on a k-t Cartesian grid with Ns PE lines; circularly rotating the sampling pattern of a previous frame; and determining if all frames have been completed, and if so, applying a nonlinear stretching operation to create a variable density sampling pattern with N PE lines.

The foregoing illustrative summary, as well as other exemplary objectives and/or advantages, and the manner in which the same are accomplished, are further explained within the following detailed description and its accompanying drawings.

BRIEF DESCRIPTION OF THE DRAWINGS

A detailed description of certain aspects of the present disclosure in accordance with various example implementations will now be provided with reference to the accompanying drawings. The drawings form a part hereof and show, by way of illustration, specific implementations and examples. In referring to the drawings, like numerals represent like elements throughout the several figures.

FIGS. 8A-8C illustrate an impact of a and s values on the sampling density;

FIGS. 9A-9E illustrate example CAVA sampling patterns;

FIGS. 13A-13F illustrate data reconstructed using Reconstructing Velocity Encoded MRI with Approximate message passing aLgorithms (ReVEAL);

DETAILED DESCRIPTION

The present disclosure is directed to a new sampling method called herein Golden-shift Ordered Cartesian sampling (GOC). GOC provides the benefits of VISTA; however, uses a novel computationally efficient methodology. The present disclosure is also directed to a new Cartesian data sampling scheme, called CArtesian sampling with Variable density and Adjustable temporal resolution (CAVA). Distinguishing features of CAVA include (i) temporal resolution that can be adjusted retrospectively, (ii) variable density to preferentially sample the central k-space at higher rate, (iii) maintaining incoherence, and (iv) ensuring a fully sampled time average to facilitate sensitive map estimation. For validation, CAVA was used to collect real-time, free-breathing, phase-contrast MRI (PC-MRI) from ten healthy volunteers. Peak velocity (PV) and stroke volume (SV) in the aorta, recovered from the highly accelerated CAVA data are compared to fully sampled segmented imaging. A t-test found the PV and SV using the real-time CAVA data were not significantly different from fully sampled segmented imaging.

Example Environment

Figure 1:
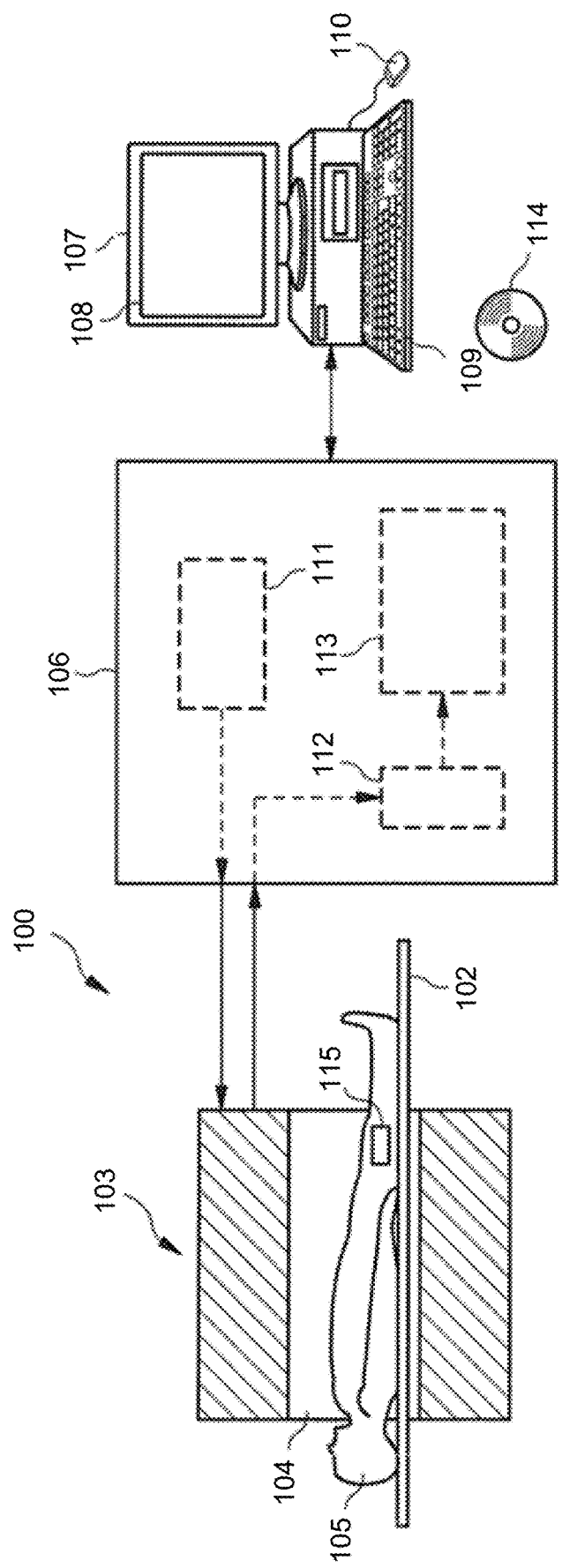
FIG. 1 is a view illustrating a structure of an example magnetic resonance imaging (MRI) apparatus that may be used to acquire image data.

FIG. 1 is a view illustrating a structure of an example magnetic resonance imaging (MRI) apparatus 100 that may be used to acquire image data. Generally, the MRI apparatus 100 is a low-field or high-field system equipped with a high-end data processing unit (DPU) to enable the implementation of structure aware (SA) recovery in clinically relevant times. The DPU may be comprised of multiple GPUs running a, e.g., a Gadgetron framework, which was developed at the National Heart, Lung, and Blood Institute. The SA recovery methods are based on Bayesian inference where the structure in the image is expressed probabilistically, as a set of priors or conditional priors. For implementation of SA recovery, fast iterative image recovery methods based on Generalized Approximate Message Passing (GAMP) may be employed, yielding fast algorithms with self-tuning parameters.

The MRI apparatus 100 includes a scanner 103 that generates magnetic fields used for the MR examination within a measurement space 104 having a patient table 102. In accordance with the present disclosure, the scanner 103 may include a wide bore 70 cm superconducting magnet having a field strength of approximately 0.5-3.0 Tesla (T).

A controller 106 includes an activation unit 111, a receiver device 112 and an evaluation module 113. During a phase-sensitive flow measurement, MR data are recorded by the receiver device 112, such that MR data are acquired in, e.g., a measurement volume or region 115 that is located inside the body of a patient 105. The MRI apparatus 100 may include an 18-coil array (e.g., arranged as two 3×3 grids); support parallel imaging using SPIRIT, GRAPPA, SENSE, VISTA, AMP, FISTA, SCoRE, and/or Bayesian Inference; and perform analog-to-digital conversion (ADC) at a gantry of the MRI apparatus 100.

An evaluation module 113 prepares the MR data such that they can be graphically presented on a monitor 108 of a computing device 107 and such that images can be displayed. In addition to the graphical presentation of the MR data, a three-dimensional volume segment to be measured can be identified by a user using the computing device 107. The computing device may include a keyboard 109 and a mouse 110. The computing device may include a Xeon central processing unit (CPU) or better; 16 GB of random access memory (RAM); Multi-GPU, K20 or Titan Z reconstruction hardware; support DiCOM 3.0; and support simultaneous scan and reconstruction.

Software for the controller 106 may be loaded into the controller 106 using the computing device 107. Such software may implement a method(s) to process data acquired by the MRI apparatus 100, as described below. It is also possible the computing device 107 to operate such software. Yet further, the software implementing the method(s) of the disclosure may be distributed on removable media 114 so that the software can be read from the removable media 14 by the computing device 107 and be copied either into the controller 106 or operated on the computing device 107 itself.

Generating GOC Sampling

Figure 2:
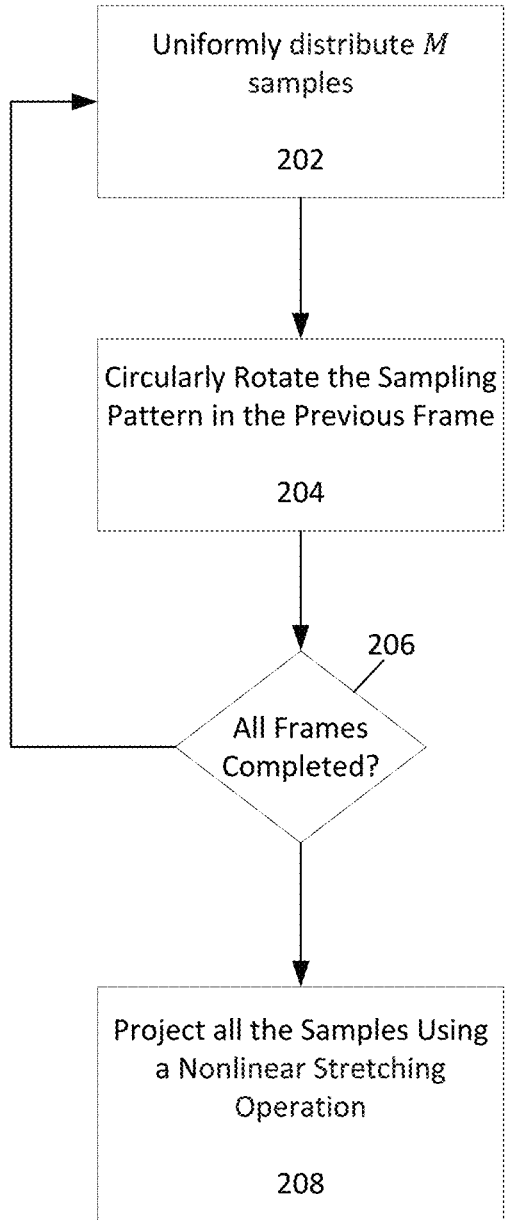
FIG. 2 illustrates an example method of generating Golden-shift Ordered Cartesian (GOC) sampling patterns for data acquisition.

With reference to FIG. 2, there is illustrated an example method 200 of generating GOC sampling patterns for data acquisition. GOC does not provide for variable temporal resolution, as such, the sampling cannot be changed after acquisition.

At 202, a first step of GOC is to create a uniformly random sampling pattern on a k-t Cartesian grid with Ns phase-encoding (PE) lines. For example, sampling on a smaller grid with $N_s$ PE lines $$\left(N_s = \frac{N}{s} s > 1\right)$$

may be performed.

At 204, the sampling pattern of the previous frame is circularly rotated. Starting from a randomly selected first PE index, $p_s$ (1), the index of the subsequent PE lines is sequentially advanced by $gN_s$, with $g=(1+\sqrt{5})/2$ (Eq. 1). Next, at 206, it is determined if all frames have been completed. If not, the process returns to 202. If completed, then at 208, a nonlinear stretching operation is applied to create a variable density sampling pattern with N PE lines.

This strategy creates a sampling pattern that has both variable density and adjustable temporal resolution. In addition, the sampling pattern aids in the estimation of coil sensitivity maps when averaged over time. The time averaged CAVA pattern covers all of k-space with an envelope that favors the center of k-space. The samples $p_s(i)$ projected using a nonlinear stretching operation to a larger grid may yield:

$$p = \left[ p_s - k \, sign\left(\frac{N_x}{2} - p_s\right)\left|\frac{N_x}{2} - p_s\right|^\alpha + \frac{1}{2}(N - N_S) \right] \quad (1)$$

where s controls the relative acceleration rate at the center of k-space compared to the overall acceleration rate, with s>1 ensuring that the sampling density is higher at the center of k-space, α>0 controls the transition from high-density central region to low-density outer region, [.] represents the rounding operation, and constant k is selected such samples ps=1 and ps=Ns are mapped to p=1 and p=N, respectively.

Figure 3A:
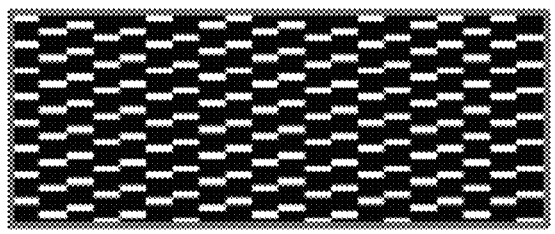
FIGS. 3A-3B illustrate an example of GOC sampling, with x-axis representing time and y-axis representing phase-encoding.
Figure 3B:
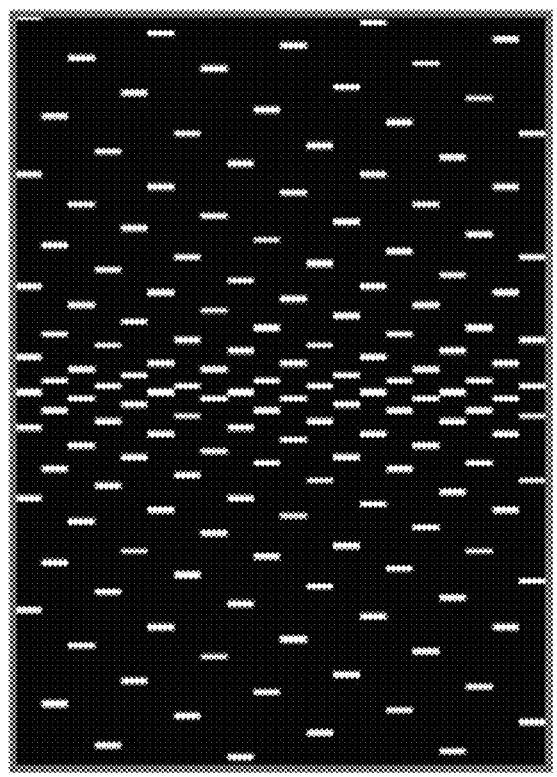
Figure 4:
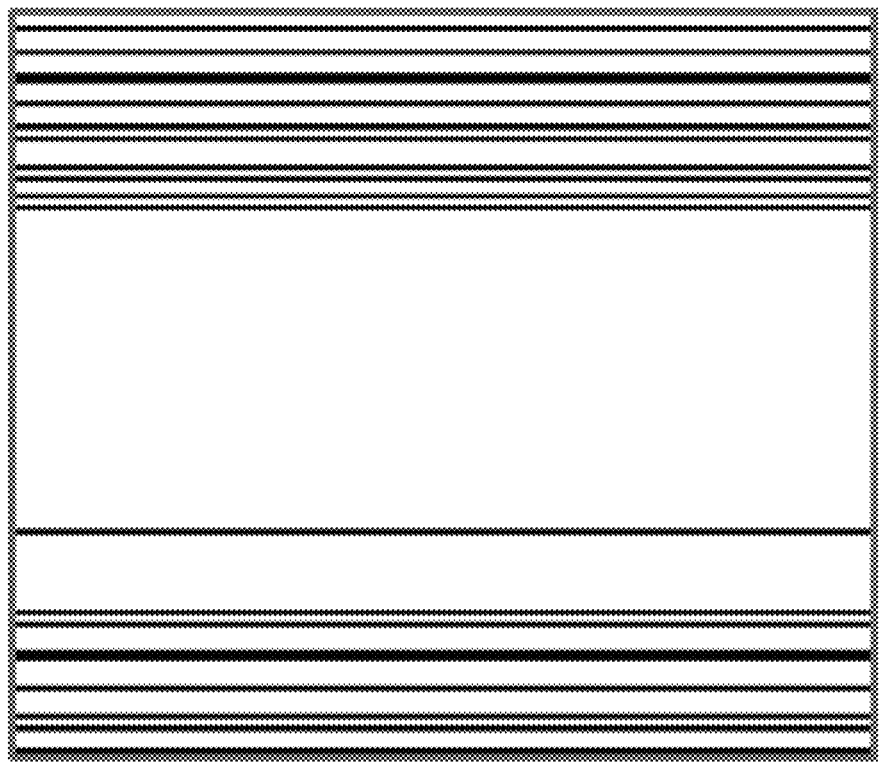
FIG. 4 illustrates time integration of the sampling pattern in FIGS. 3A-3B, with x-axis representing frequency-encoding and y-axis representing phase-encoding.
Figure 5:
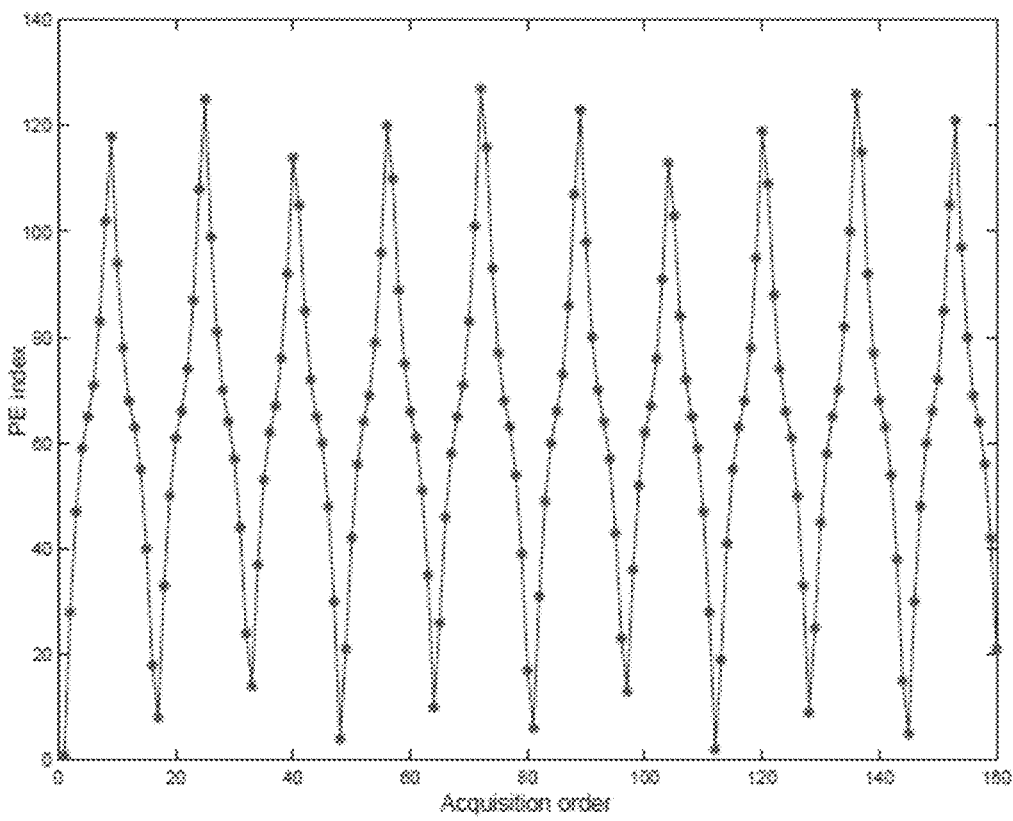
FIG. 5 illustrates a phase encoding index plotted against the order in which the readout lines was collected.

FIGS. 3A-3B illustrate an example of GOC for N=128, s=4, T=20, M=8, and α=2.2. FIG. 3A shows sampling on the Ns×T grid. The horizontal axis indicates frames and the vertical axis indicates the phase encoding direction. FIG. 3B shows sampling on a N×T grid generated from A by non-linear stretching describe in Eq. 1. FIG. 4 illustrates time integration of the sampling pattern in FIGS. 3A and 3B. The horizontal axis represents readout, and the vertical axis represents phase encoding index. White areas represent locations that were sampled at least in one of the frames. FIG. 5 illustrates a phase encoding index (vertical) plotted against the order in which the lines was collected.

Generating CAVA Sampling

Figure 6:
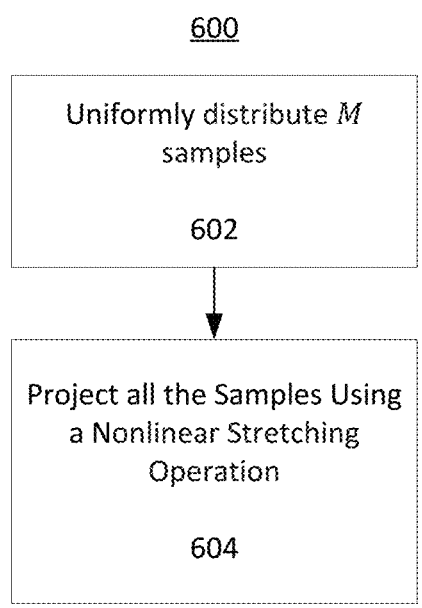
FIG. 6 illustrates an example method of generating CArtesian sampling with Variable density and Adjustable temporal resolution (CAVA) sampling patterns for data acquisition.

With reference to FIG. 6, there is illustrated an example method 600 of generating CAVA sampling patterns for data acquisition. CAVA may be used in situations where the optimal temporal resolution is not known. These variations may be caused from variations in heart rate, stress on the, etc. CAVA allows for retrospective adjustment of the temporal resolution. Thus, there will be a lower likelihood of repeat scans and a higher success rate for the initial scan.

At 602, a first step is to generate a sequence of indices on a smaller grid of size $N_s$=round(N/s). Starting from a randomly selected first PE index, $p_s(1)$, the PE indices of the subsequent readouts are sequentially advanced by $gN_s$, yielding:

$$p_s(i+1) = (p_s(i) + gN_s)_{N_s}, \quad (2)$$

where $p_s(i)$ represents the PE index of the $i^{th}$ sample on the grid of size $N_s$, $g=(\sqrt{5}-1)/2$ is the golden ratio, and $\langle \cdot \rangle_{N_s}$ represents remainder modulo $N_s$.

Next, at 604, a nonlinear stretching operation is applied to create a variable density sampling pattern with N PE lines. This strategy creates a sampling pattern that has both variable density and adjustable temporal resolution. In addition, the sampling pattern aids in the estimation of coil sensitivity maps when averaged over time. The time averaged CAVA pattern covers all of k-space with an envelope that favors the center of k-space. The samples $p_s(i)$ projected using a nonlinear stretching operation to a larger grid may yield:

$$p(i) = p_s(i) - k \, sign\left(\frac{N_x}{2} - p_s(i)\right)\left|\frac{N_x}{2} - p_s(k)\right|^\alpha + \frac{1}{2}(N - N_S) \quad (3)$$

$$P_c(i) = [p(i)] \quad (4)$$

where $p_c(i)$ is the PE index of the $i^{th}$ sample on the grid with PE lines, s controls the relative acceleration rate at the center of k-space compared to the overall acceleration rate, with s>1 ensuring that the sampling density is higher at the center of k-space, α≥0 controls the transition from high-density central region to low-density outer region, [•] represents the rounding operation, and constant k≥0 is selected such samples $p_s$=1 and $p_s$=N are mapped to p=1 and p=N, respectively. In accordance with the disclosure, s=3 and α=3 may be used.

Figure 7:
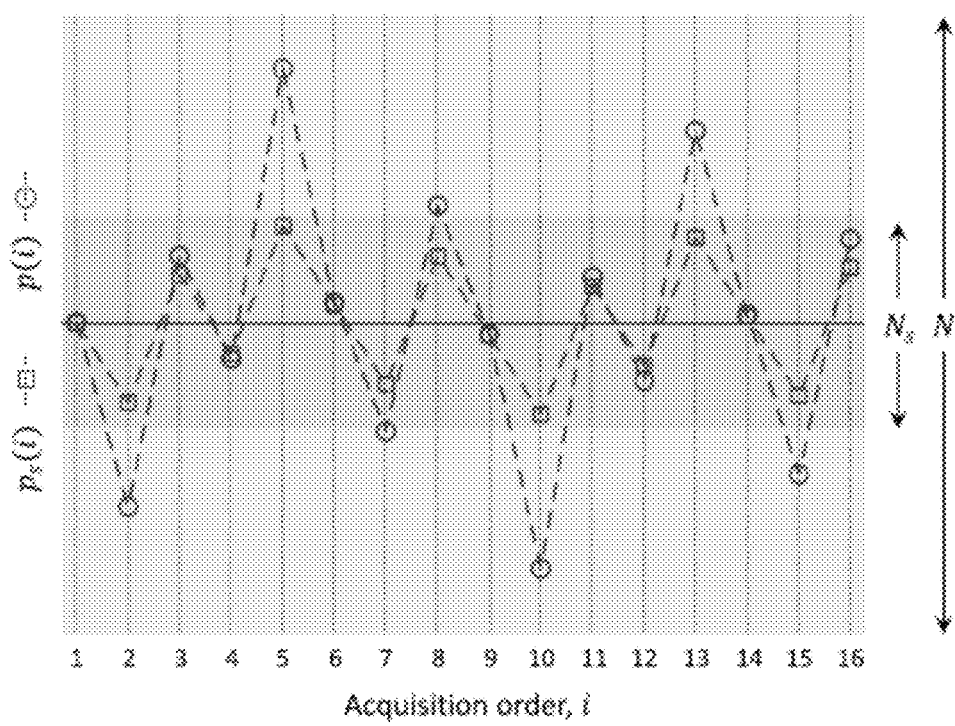
FIG. 7 illustrates a non-linear stretching process.

FIG. 7 depicts the non-linear stretching process from smaller Ns-grid to the final N-grid. Due to the golden ratio jumps in k-space, CAVA sampling patterns can be re-binned to different temporal resolutions. As shown in FIG. 7, a phase-encoding sequence, ps(i) is generated on a smaller grid by adding a golden ratio offset from one sample to the next (Eq. 3). Then, each element of the sequence is vertically stretched to generate p(i). Here, N=84 and Ns=28. In FIG. 7, only 16 samples are shown.

FIGS. 8A-8C illustrate the impact of a and s values on the sampling density. FIG. 8A show CAVA patterns from six different combinations of a and s are shown. FIG. 8B shows sampling frequency when α is varied and s is fixed at 2. FIG. 8C shows sampling frequency when α is varied and s is fixed at 3. Here, N=90.

FIGS. 9A-9E illustrate example CAVA sampling patterns. FIG. 9A illustrates retrospective adjustment of temporal resolution with CAVA. All sampling patterns are generated from the same sequence of phase encoding indices. The resolution was retrospectively changed by assigning different number of lines per frame (LPF). FIG. 9B illustrates a composite sampling pattern, which is a union of two independent CAVA, with one used to collect compensated data and the other used to collect velocity encoded data. The two CAVA patterns consistently interleave each other because they are shifted with respect to each other before stretching. For phase contrast MRI, two different sampling patterns are created, one for the velocity compensated measurement and one for the velocity encoded measurement. To accomplish this, the velocity compensated pattern can be circularly shifted in the time dimension to offset the two patterns. FIG. 9B further illustrates an example of CAVA sampling patterns for PC-MRI. FIG. 9C illustrates a time averaged CAVA pattern after acquiring 10 lines. FIG. 9D illustrates a time averaged CAVA pattern after acquiring 100 lines. FIG. 9E illustrates a time averaged CAVA pattern after acquiring 1000 line. As the number of samples increase, a smooth, Gaussian like envelope develops.

Methods

Data Acquisition from a Pulsatile Flow Phantom

Figure 10A:
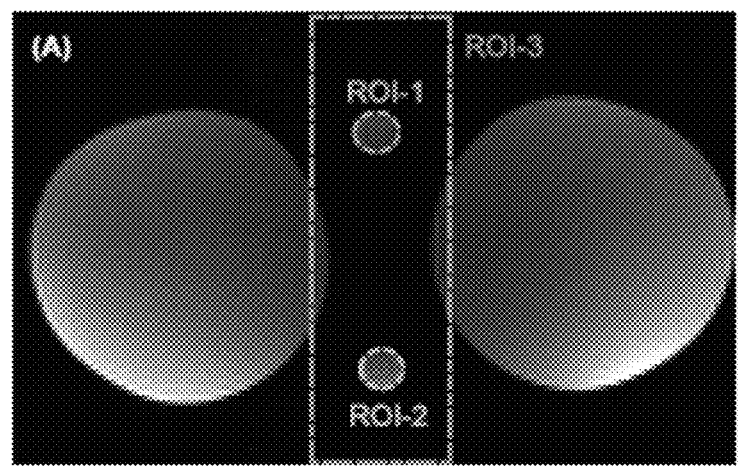
FIGS. 10A-10C illustrate a pulsatile flow phantom.
Figure 10B:
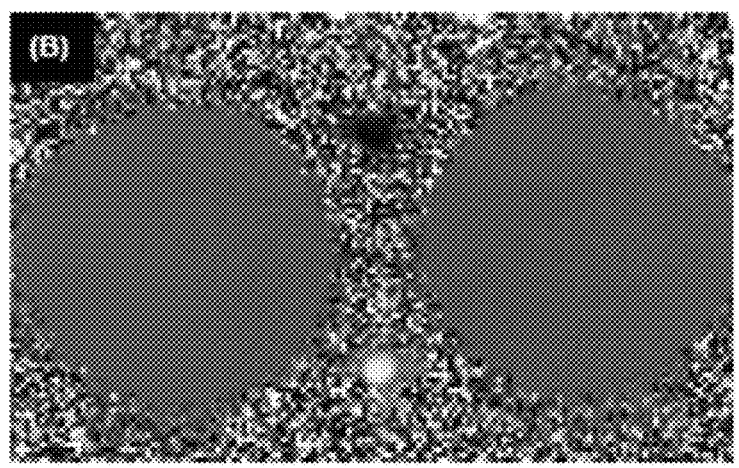
Figure 10C:
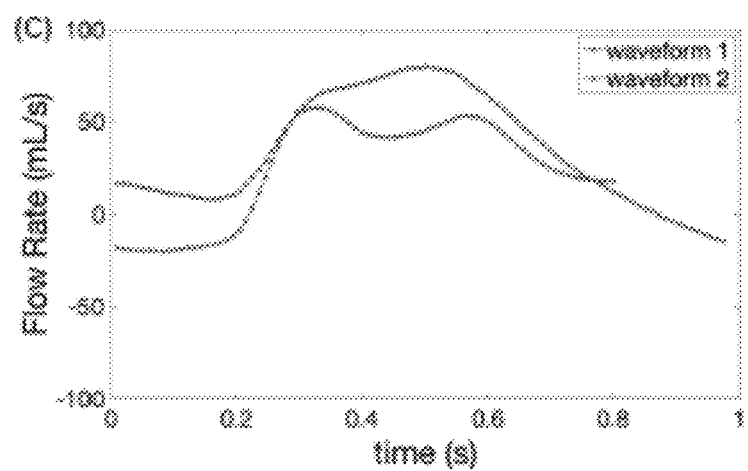

A pulsatile flow phantom experiment was performed to acquire fully sampled PC-MRI data at high temporal resolution. The pulsatile flow was applied to a pipe, with inner diameter of ⅝ inch, placed in a U-shape arrangement inside the magnet bore. Two water bottles supported the pipe, as shown in FIGS. 10A-10C which illustrate a pulsatile flow phantom. FIG. 10A shows a slice showing a cross section of two large water bottles and the tubes carrying pulsatile flow in opposite directions. The regions of interest used to quantify peak velocity and stroke volume (ROI-1 and ROI- 2) as well as rSNR (ROI-3) are identified. FIG. 10I3 shows the velocity image corresponding to the magnitude image shown in FIG. 10A. FIG. 10C shows the flow rate in ROI-2 for two (out of eight) different waveforms The imaging plane was approximately perpendicular to the flow direction. All data were acquired using a 1.5 T (MAGNETOM, Avanto, Siemens Healthcare, Erlangen, Germany) scanner with 18-channel cardiac array. A total of eight fully sampled data sets were collected, each with a different pulsatile waveform set using a programmable pump (MR 5000 by Shelley Medical Imaging Technologies, Toronto, Ontario, Canada). In addition to the shape of the waveform, the duration of the pulsatile cycle was varied between 750 ms and 1,200 ms across the eight acquisitions. The data were collected with prospective triggering using a traditional GRE-based sequence, with flow-encoded and flow-compensated readouts interleaved. To maintain high temporal resolution, segment size was selected to be one, that is, one velocity encoded and one velocity-compensated readouts were recorded in each segment. With TR=5.13 ms, it led to a temporal resolution of 10.26 ms. The other relevant scan parameters were: TE=3.18 ms, flip angle=15 degrees, acquisition matrix=90×144, FOV=178×280 mm, scan time=68 to 108 s, VENC=150 cm/s, slice thickness=8 mm, acquisition bandwidth=503 Hz/pixel, and asymmetric echo off. The data were retrospectively under-sampled with two Cartesian sampling patterns: VISTA15 and CAVA. VISTA is a variable density pseudo-random sampling pattern that is based on Riesz energy minimization. Starting from a random initialization, VISTA iteratively updates the sampling pattern to maximize separation among the neighboring samples. VISTA allows variable density but does not permit retrospective adjustment of temporal resolution. We recently extended VISTA for PC-MRI. 16 Using VISTA and CAVA patterns, the under-sampling process was repeated to simulate six different readout lines per frame (LPF), that is, LPF (k)=4, 5, 6, 8, 10, and 15, leading to temporal resolutions (2×k×TR) of 41.0, 51.3, 61.6, 82.1, 102.6, and 153.9 ms, respectively. To mimic the real-time acquisition, only one readout was selected from each fully sampled frame. For example, the first CAVA index was picked from the first fully sampled frame, the second CAVA index was picked from the second frame, and so forth. For CAVA, only one sampling pattern was used, and different temporal resolutions were realized by binning k consecutive samples into one temporal frame. In contrast, for VISTA, a separate sampling pattern was generated for each temporal resolution. Since exact realizations of CAVA and VISTA depend on the starting point, ps(1), and initial distribution of samples, respectively, the retrospective under-sampling process was repeated for three different randomly selected values of ps(1) for CAVA and three random initializations for VISTA.

Data Acquisition from Healthy Volunteers

To further evaluate the performance of CAVA, PC-MRI data were collected from 10 healthy volunteers. All data were acquired using a 3 T (MAGNETOM, Prisma, Siemens Healthcare, Erlangen, Germany) scanner with 48-channel cardiac array. Each volunteer was imaged with both fully sampled BSI and FRI CAVA acquisition.

The data were collected using a traditional GRE-based sequence, with flow-encoded and flow-compensated readouts interleaved. BSI data were collected with retrospective triggering, while the CAVA data were collected continuously for 10 s. The order of two acquisitions was randomized across volunteers. The imaging plane was prescribed perpendicular to the ascending aorta above the aortic valve. The other relevant scan parameters were: TR=4.21 ms, TE=2.12 ms, flip angle=15 degrees, acquisition matrix=84×128, FOV=250×300 mm, CAVA scan time=10 s, VENC=150 cm/s, slice thickness=6 mm, acquisition bandwidth=698 Hz/pixel, and asymmetric echo on. The data from each CAVA scan were retrospectively re-binned to create six data sets with 4, 5, 6, 8, 10, and 15 LPF (k) for temporal resolutions of 33.7, 42.1, 50.5, 67.4, 84.2, and 126.3 ms, respectively. For BSI, the relevant scan parameters were: TR=4.64 ms, TE=2.47 ms, acquisition matrix=(108–131)× (144–176), FOV=(230–282)×(280–340) mm, VENC=150 cm/s, slice thickness=6 mm, acquisition bandwidth=451 Hz/pixel, isotropic image resolution=1.7-1.9 mm, and temporal resolution=37.1 ms. To highlight the impact of respiration on FRI flow quantification, we additionally collected a CAVA data set from one of the healthy volunteers over a span of 27 s under deep breathing conditions.

Image Recovery and Analysis for Pulsatile Flow Phantom

To reconstruct the accelerated CAVA data sets, the Reconstructing Velocity Encoded MRI with Approximate message passing aLgorithms (ReVEAL) technique was used. ReVEAL exploits wavelet sparsity as well as magnitude and phase similarities across velocity encodings to jointly reconstruct the velocity encoded and velocity compensated images. ReVEAL introduces three tuning parameters. The first parameter, $\lambda$ controls the regularization strength for wavelet domain sparsity. The second parameter, $\omega$, represents the variance of noise in k-space. The third parameter, $\sigma$, represents a measure of magnitude and phase similarity across velocity encodings. The k-space noise variance, $\omega$, was estimated from the outer portions of k-space. The other two parameters were tuned by subjectively evaluating the image quality from a single CAVA data set with k=6. The parameter values were held constant for all pulsatile waveforms, sampling realizations, and temporal resolutions. ReVEAL was implemented in custom Matlab software (Mathworks, Natick, Mass.) and run offline on a Windows 7 PC equipped with a Tesla K40c GPU (Nvidia, Santa Clara, Calif.). The software utilizes GPU acceleration for a runtime of approximately 3 minutes. Open source software for ReVEAL is available online at GitHub (Open source software available at https://github.com/arg-min-x/ReVEAL). Coil sensitivity maps were estimated using ESPIRiT. 19 The reconstructed image series were converted to DICOM, and the cross section of the pipes was then segmented using Segment software. 20 The peak velocity (PV), stroke volume (SV), and recovery signal-to-noise ratio (rSNR) for each waveform and sampling realization were defined as follows:

$$SV_{i,j}^k = \text{Stroke Volume: } i^{th} \text{ Sampling, } j^{th} \text{ Waveform, } LPF = k \quad (5)$$

$$PV_{i,j}^k = \text{Peak Volume: } i^{th} \text{ Sampling, } j^{th} \text{ Waveform, } LPF = k \quad (6)$$

$$rSNR_{i,j}^k = -20\log_{10}\left[\frac{\|\hat{x}_{i,j}^k - x_j^k\|}{\|x_j^k\|}\right] \quad (7)$$

for $i = 1, 2, \ldots, I$
$j = 1, 2, \ldots, J$
$k = 4, 5, 6, 8, 10, 15,$ where $\hat{x}_{i,j}^k$ represents images reconstructed using ReVEAL from under-sampled data, and $x_j^k$ represents fully sampled images with temporal resolution matched to that of $\hat{x}_{i,j}^k$. To generate $x_j^k$ images, k consecutive frames of the original high-resolution images were averaged. We refer to these fully sampled images with matched resolution as FS-MR. To assess variability of SV and PV in images recovered from CAVA and VISTA data sets, normalized values of SV and PV were calculated as a percentage of the reference values, yielding:

$$NSV_{i,j}^k = \frac{SV_{i,j}^k}{SVREF_j} * 100 \quad (8)$$

$$NPV_{i,j}^k = \frac{PV_{i,j}^k}{PVREF_j} * 100 \quad (9)$$

for all $i$, $j$, and $k$, where $PVREF_j$ and $SVREF_j$ represent peak velocity and stroke volume, respectively, calculated from the fully sampled high-resolution reference. For both CAVA and VISTA, t-tests ($\alpha=0.05$) were performed to compare $NSV_{i,j}^k$ and $NPV_{i,j}^k$ to the reference value of 100. The values of $rSNR_{i,j}^k$ from CAVA and VISTA were also compared to each other using t-test ($\alpha=0.05$). For each k value, the t-test was performed by aggregating all entries for different i and j values. Due to observable difference in the flow profiles, the two cross sections (ROI-1 and ROI-2 shown in FIG. 10A) of the pipe were treated separately, leading to 16 "waveforms." Therefore, for SV and PV, J=16, and for rSNR, J=8. To emphasize contributions from dynamic regions, ROI-3 was used to calculate rSNR, as shown in FIGS. 10A-10C.

Image Recovery and Analysis for Healthy Volunteers

The accelerated CAVA data sets were reconstructed using ReVEAL. The reconstructed image series were converted to DICOM, and the aortic cross section was then segmented using Segment software. The PV and SV values for each heartbeat were calculated and computed against the fully sampled BSI reference.

For flow quantification, we define the following parameters:

$$SV_{i,j}^k = \text{Stroke Volume: } i^{th} \text{ Hearbeat,} j^{th} \text{ Volunteer,} \quad LPF=k \quad (10)$$

$$PV_{i,j}^k = \text{Peak Velocity: } i^{th} \text{ Hearbeat,} j^{th} \text{ Volunteer,} \quad LPF=k \quad (11)$$

for i=1, 2, . . . , I j=1, 2, . . . , J k=4, 5, 6, 8, 10, 15

To assess variability of SV and PV in images recovered from CAVA data sets, normalized values of SV and PV were calculated as a percentage of the reference values, yielding:

$$NSV_{i,j}^k = \frac{SV_{i,j}^k}{SVREF_j} * 100 \quad (12)$$

$$NPV_{i,j}^k = \frac{PV_{i,j}^k}{PVREF_j} * 100 \quad (13)$$

for all $i$, $j$, and $k$, where $PVREF_j$ and $SVREF_j$ are the peak velocity and stroke volume for the jth volunteer calculated from the BSI reference. In addition, t-tests ($\alpha=0.05$) were performed to compare $NSV_{i,j}^k$ and $NPV_{i,j}^k$ values from all heartbeats (i) and volunteers (j) to the reference value of 100. The t-test was separately performed for each value of k.

Results

Figure 11A:
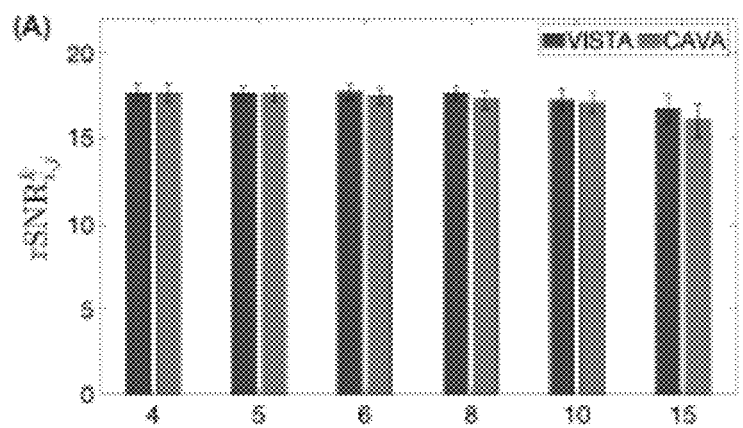
FIGS. 11A-11C illustrate flow quantification and recovery SNR results from the pulsatile flow phantom of FIGS. 10A-10C.
Figure 11B:
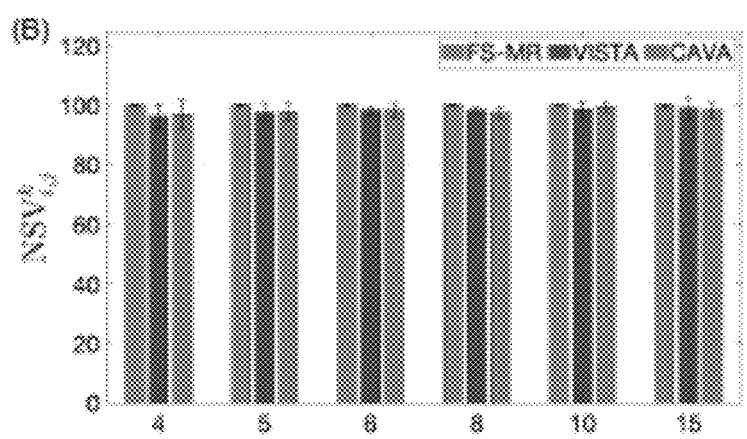
Figure 11C:
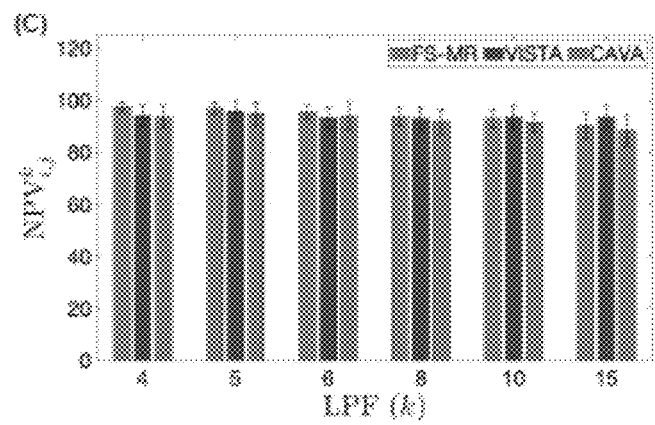

In the first study, PC-MRI data for a pulsatile flow phantom was collected and processed. To create a high-quality reference, eight fully sampled data sets were collected, each with a different flow waveform. For SV and PV quantification, the high temporal resolution images served as a reference, while, for rSNR quantification, FS-MR images served as a reference. The quantitative results are shown in FIGS. 11A-11C. The bars represent mean values, while the error bars represent ±std. For each value of k, mean±std were calculated from all waveforms (j) and sampling realizations (i). TABLE 1, below, summarizes the mean values shown in FIGS. 11A-11C and additionally provides t-test results. FIGS. 11A-11C illustrate flow quantification and recovery SNR results from the pulsatile flow phantom. FIG. 11A shows recovery SNR (rSNR) for VISTA and CAVA for eight different flow waveforms (j) and three realizations (i) of the sampling pattern. FIG. 11B shows normalized SV across 16 different waveforms (eight from ROI-1 and eight from ROI-2) and three different sampling realizations. FIG. 11C shows a same comparison as (B) but for normalized PV. The results are presented as mean±std for different temporal resolutions, k.

TABLE 1 shows Flow and rSNR quantification for phantom data:

TABLE 1

| k | 4 | 5 | 6 | 8 | 10 | 15 |
|---|---|---|---|---|---|---|
| rSNR | | | | | | |
| CAVA-VISTA | 0.011 | −0.078 | −0.226 | −0.355 | −0.192 | −0.650 |
| t-test | 0 | 1 | 1 | 1 | 1 | 1 |
| NSV | | | | | | |
| CAVA-VISTA | 0.468 | 0.394 | 0.026 | −0.631 | 0.860 | −0.740 |
| t-test | 0 | 0 | 0 | 1 | 1 | 0 |
| CAVA-Ref. | −3.156 | −1.975 | −1.596 | −2.268 | −0.430 | −1.545 |
| t-test | 1 | 1 | 1 | 1 | 1 | 1 |
| VISTA-Ref. | −3.625 | −2.369 | −1.622 | −1.637 | −1.290 | −0.805 |
| t-test | 1 | 1 | 1 | 1 | 1 | 0 |
| NPV | | | | | | |
| CAVA-VISTA | −0.500 | −1.114 | 0.815 | −0.941 | −2.070 | −5.114 |
| t-test | 0 | 1 | 0 | 0 | 1 | 1 |
| CAVA-Ref. | −6.32 | −5.157 | −6.002 | −8.036 | −8.587 | −11.61 |
| t-test | 1 | 1 | 1 | 1 | 1 | 1 |
| VISTA-Ref. | −5.827 | −4.043 | −6.818 | −7.095 | −6.517 | −6.493 |
| t-test | 1 | 1 | 1 | 1 | 1 | 1 |

Figure 12A:
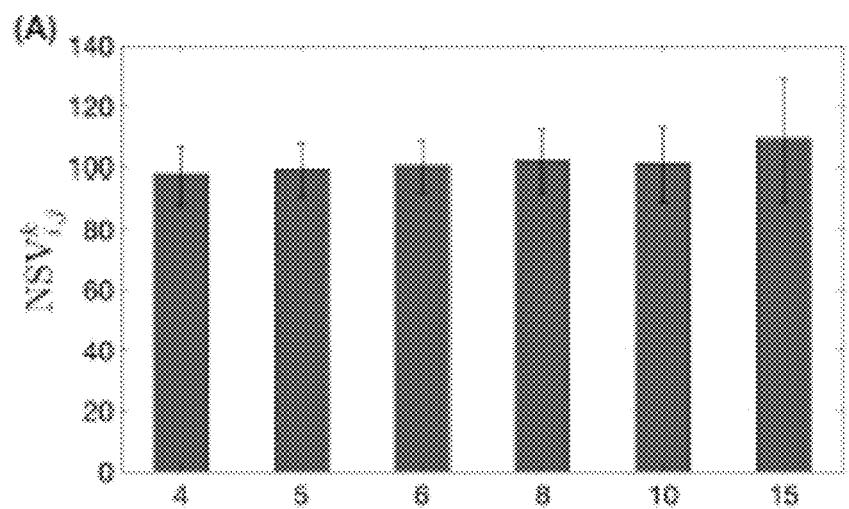
FIGS. 12A-12B illustrate flow quantification results compiled from volunteers.
Figure 12B:
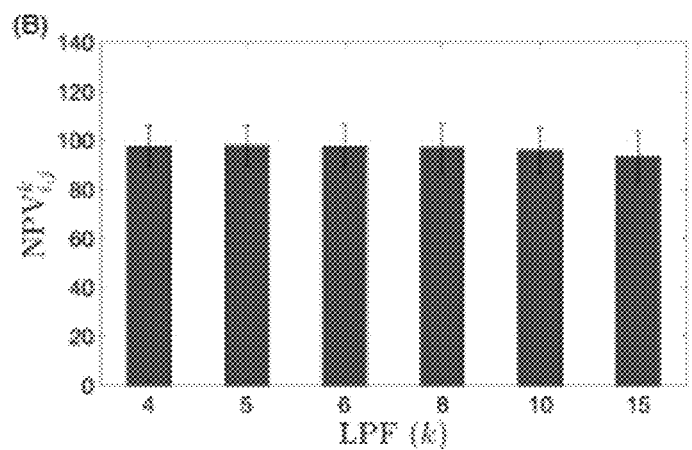

To demonstrate the application of CAVA to real-time PC-MRI, we compared SV and PV from FRI CAVA with that from BSI using data from healthy volunteers. FIGS. 12A-12B provides quantification for NSV and NPV from the prospectively undersampled data collected from 10 volunteers. FIGS. 12A-12B illustrate flow quantification results compiled from 10 healthy volunteers. For each LPF, the NSV (A) and NPV (B) values for all heartbeats (i) from all volunteers (j) are presented using mean±std. Here, the value of 100 represents quantification from BSI data sets. For each value of k, mean±std were calculated from all volunteers (j) and heartbeats (i). TABLE 2 summarizes the results shown in FIGS. 12A-12B and additionally provides t-test results. For NSV, there is a good agreement between CAVA and BSI reference for k≤15, with the largest discrepancy between the mean values less than 3%. At k=15, the in vivo images exhibit strong artifacts (see, FIGS. 13A-13F) due to model mismatch, leading to overestimation and wider spread in NSV. As was the case with the phantom data, NPV underestimation is more pronounced at lower temporal resolutions. The underestimation, however, stays within 5% except for k=15.

TABLE 2 Flow quantification results for volunteer data. Each entry represents the mean of the difference between CAVA and BSI reference.

TABLE 2

| | (Ref.) | | | | | |
|---|---|---|---|---|---|---|
| k | 4 | 5 | 6 | 8 | 10 | 15 |
| | NSV | | | | | |
| CAVA-Ref. | −2.639 | −0.982 | 0.246 | 1.989 | 1.036 | 9.064 |
| t-test | 1 | 0 | 0 | 0 | 0 | 1 |
| | NPV | | | | | |
| CAVA-Ref. | −2.420 | −1.996 | −2.295 | −3.006 | −3.919 | −6.535 |
| t-test | 1 | 1 | 1 | 1 | 1 | 1 |

The overall performances of CAVA and VISTA were comparable, with VISTA exhibiting slight advantage in terms of rSNR. The advantage of VISTA was within 0.5 dB for k≤10; only at k=15, VISTA had larger than 0.5 dB advantage. For NSV, the quantification from VISTA and CAVA were comparable. Although the NSV values from VISTA and CAVA were statistically different for k=8 and k=10, the largest difference (0.860 at k=10) between the mean NSV values from VISTA and CAVA was less than 1% of the reference. The NSV values from both methods were statistically different (except for VISTA at k=15) from the high-resolution fully sampled reference, but their mean values were within 4% of the reference. For NPV, the quantification of VISTA and CAVA were comparable, with CAVA exhibiting slight underestimation compared to VISTA. The mean difference between CAVA and VISTA was within 2% for k≤8 but grew to over 5% for k=15. Also, the NPV values for both methods were statistically different from the high-resolution fully sampled reference but, except for CAVA at k=15, were within 10% of the reference on average.

Figure 14A:
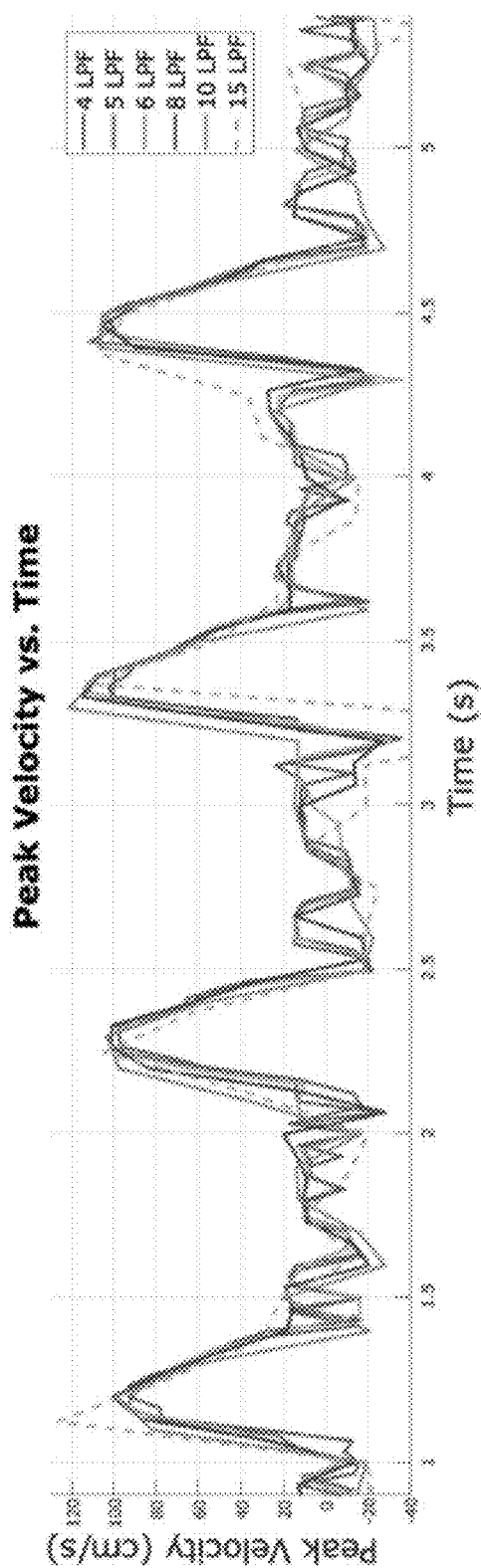
FIG. 14A illustrates a peak velocity profiles from different lines per frame (LPF) values.
Figure 14B:
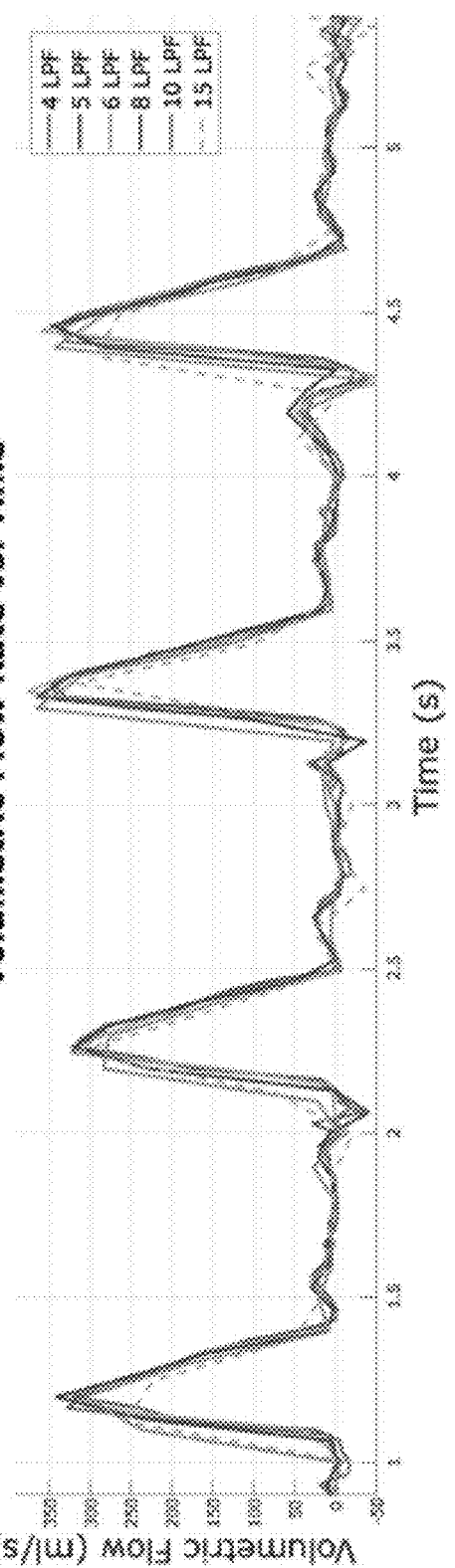
FIG. 14B illustrates volumetric flow rate from different LPF values.
Figure 15:
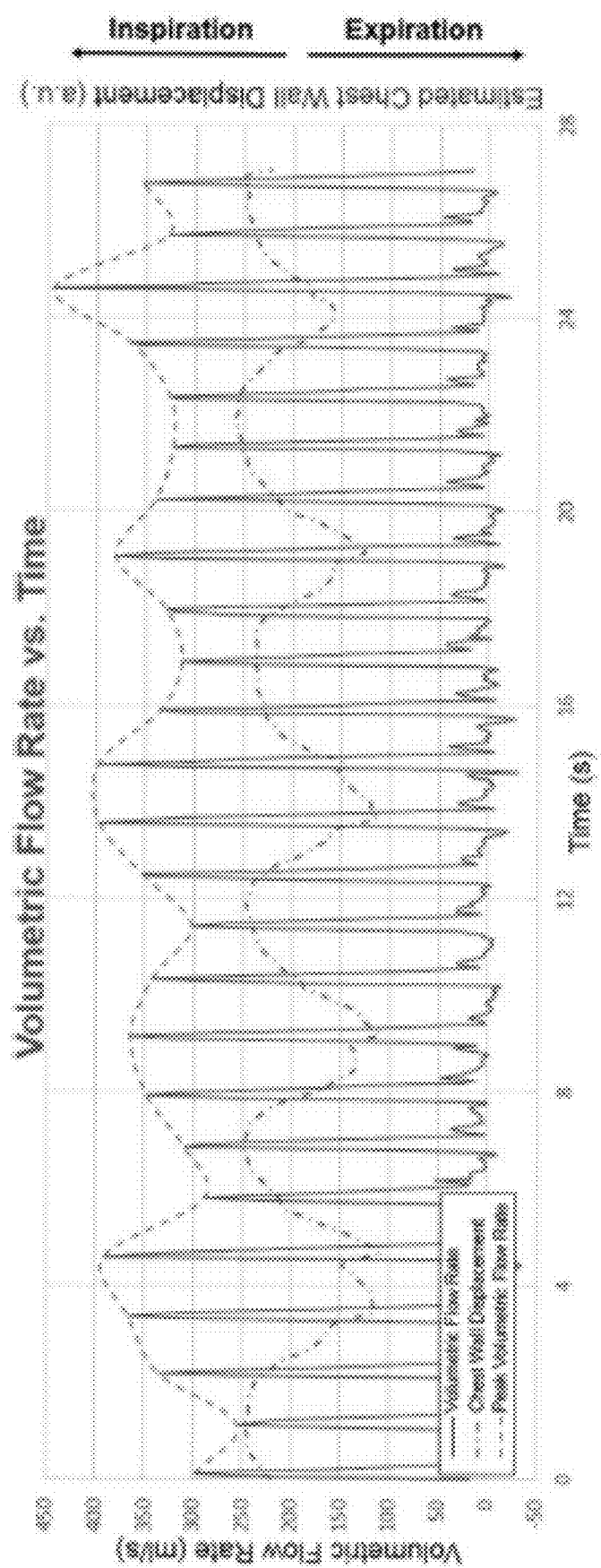
FIG. 15 illustrates an impact of respiration on free-breathing CAVA images.

FIGS. 13A-13F and 14A-14B illustrate data reconstructed using ReVEAL. To visually assess image quality, representative image frames for a single volunteer are shown in FIGS. 13A-13F. FIGS. 13A-13F shows selected frames from a single volunteer for LPF (k)=4, 5, 6, 8, 10, 15, which correspond to temporal resolutions of 33.7, 42.1, 50.5, 67.4, 84.2, 126.3 ms, respectively. FIG. 14A shows peak velocity profiles from different LPF values. FIG. 14B shows volumetric flow rate from different LPF values Both magnitude and phase images are shown for six different temporal resolutions, indexed by LPF. FIGS. 14A-14B show PV and volumetric flow profiles for 4 consecutive heartbeats for different LPF values. FIG. 15 highlights the potential impact of respiration on free-breathing CAVA images. The chest wall displacement observed from the reconstructed image series was used as a surrogate for respiratory motion.

Discussion

For MRI, non-Cartesian trajectories can offer several advantages, including variable density and incoherent artifacts. A variable density pattern maximizes k-space signal-to-noise ratio for a given readout duration, and incoherent artifacts facilitate the application of CS. More recently, golden angle-based radial and spiral trajectories have been proposed for 2D real-time CMR. These acquisition schemes provide the added flexibility of adjusting temporal resolution retrospectively. In contrast, existing Cartesian trajectories are not equipped to combine retrospective adjustment of temporal resolution and variable density. We have proposed a new sampling method, called CAVA, that successfully combines artifact incoherence, variable density that can be parametrically controlled, and ability to vary temporal resolution after the acquisition.

Data collection with CAVA, when combined with ReVEAL reconstruction, can allow highly accelerated real-time imaging. In this work, the combination of CAVA and ReVEAL enabled PC-MRI at acceleration rates as high as R=22.5 (LPF=4). Previously, real-time PC-MRI at such high acceleration rates had only been possible with non-Cartesian acquisitions. 22 Our validation study, although small, supports the feasibility of real-time PC-MRI with Cartesian sampling and retrospective adjustment of temporal resolution.

The rSNR results from the phantom data highlight that performance of CAVA, in terms of overall image quality, is comparable to that of VISTA. At the very low temporal resolution of 153.9 ms, however, rSNR of CAVA is lower by more than 0.5 dB. For flow quantification, the performances of VISTA and CAVA are comparable for k<8, with CAVA exhibiting slightly higher underestimation of NPV for k≥8. The slightly inferior performance of CAVA, especially at lower temporal resolutions, can be attributed to the sampling distribution that is only approximately uniform and can lead to samples that are clustered together as seen in FIG. 9C, where three central lines appears to be clustered together. This clustering is more pronounced for larger values of LPF due to the overall higher sampling density. In the case of VISTA, the gap between neighboring readouts are regulated using an optimization framework that leads to more even coverage of k-space. However, unlike VISTA and other similar methods, CAVA allows retrospective adjustment of temporal resolution.

The quantitative results from volunteer imaging follow the results from phantom imaging. The NSV and NPV values for CAVA closely match the BSI values for k≤10. As is the case for phantom imaging, a slight underestimation is observed in NSV at k=4, which can be attributed to regularization-induced blurring at a high acceleration rate. CAVA also underestimates PV with respect to the high-resolution reference. The underestimation of in vivo data is smaller than the one observed for the phantom data. This can be attributed to the difference in the temporal resolution of the reference. For phantom, the reference has a temporal resolution of 10.26 ms, while it is 37.1 ms for in vivo. For phantom imaging, when the CAVA NPV values are compared to temporal resolution matched reference, FS-MR, the underestimation is reduced to less than 4% for all k. Another disparity between the two studies is that NSV at k=15 is overestimated for the in vivo study, while no such overestimation is observed for the phantom study. We attribute this overestimation to image artifacts (FIGS. 13A-13F) due the intra-frame model mismatch at poor temporal resolution. In the case of phantom, however, due to the small number of dynamic pixels, the model mismatch-related artifacts are limited. Overall, both studies support the central premise that CAVA enables retrospective adjustment of temporal resolution without a significant loss in performance for clinically acceptable temporal resolutions (k≤6).

To highlight the dependence of cardiac output on respiration, additional data from one healthy volunteer was analyzed. The data were collected continuously for 27 s using CAVA sampling. To amplify the effect of inspiration, the volunteer was instructed to breathe deeply during the scan. The images were reconstructed at a resolution of 50.5 ms. FIG. 15 depicts volumetric flow rate profiles over the span of 27 s as well as the chest wall displacement estimated by registering magnitude images across different frames. As seen in FIG. 15, the measurements suggest a decrease in cardiac output during inspiration. Although this modulation in cardiac output contributes additional variation in FIGS. 12A-12B compared to FIGS. 11A-11C, it also highlights the potential of CAVA-based FRI to study respirophasic changes in cardiac function in patients with constrictive physiology.

Figure 16:
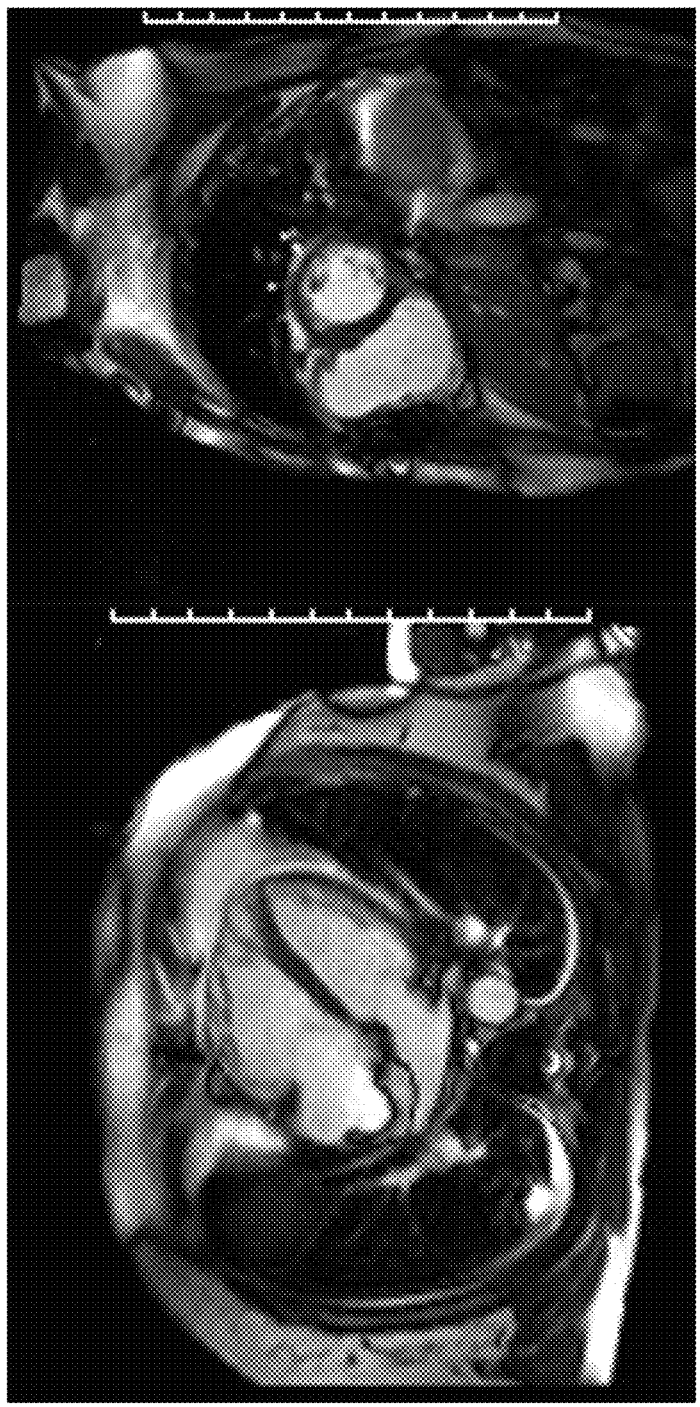
FIG. 16 illustrates real-time cine from a patient scanned using GOC.
Figure 17:
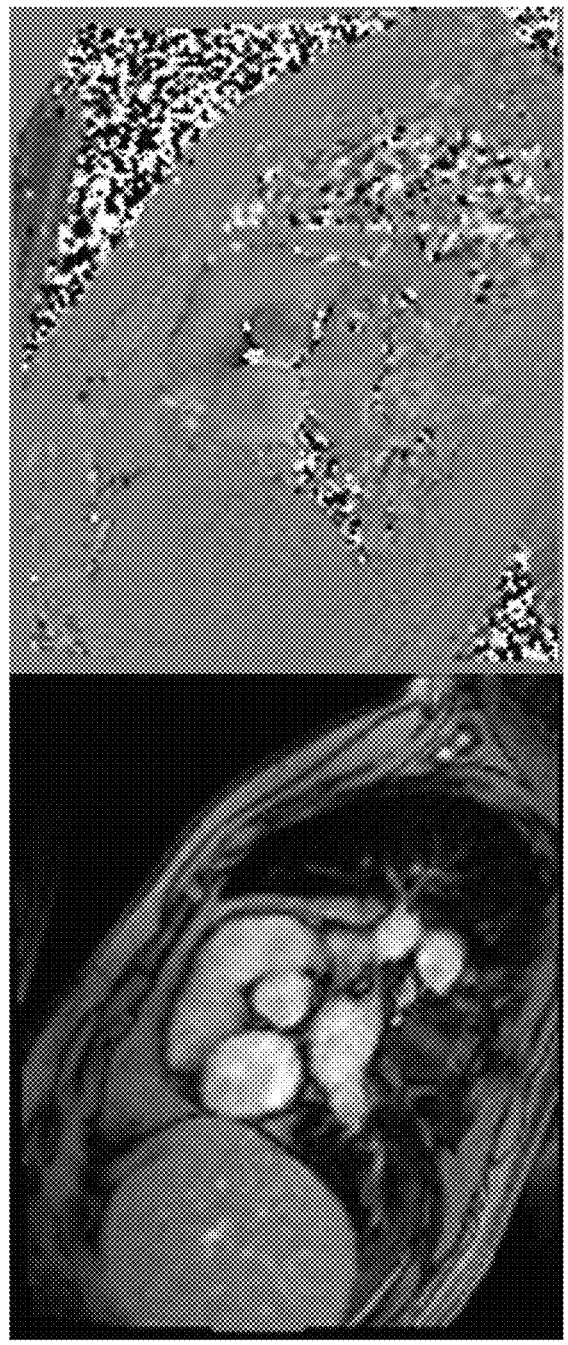
FIG. 17 illustrates real-time flow from a patient scanned using CAVA.

FIG. 15 illustrates an example of physiological changes in SV as a function of breathing cycle. The volumetric flow rate for a volunteer over 27 s is shown in blue. An estimate of the chest wall motion is given in red. The SV decreases during inspiration, which is consistent with earlier studies Experimental Results FIG. 16 illustrates real-time cine from a patient scanned using GOC. FIG. 17 illustrates real-time flow from a patient scanned using CAVA. The images shown in FIG. 16 were collected from 365 real-time cine scans performed using GOC and 35 first-pass perfusion scans performed using GOC. The images shown in FIG. 17 were collected from 103 real-time flow scans performed using CAVA.

Conclusion

Thus, the present disclosure describes a novel sampling method, CAVA, that exhibits variable density and adjustable temporal resolution. CAVA provides a Cartesian alternative to the golden angle radial sampling and may benefit a wide range of dynamic MRI applications, including real-time PC-MRI.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. The present disclosure is capable of other implementations and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary implementations include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing example implementations, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

As discussed herein, a "subject" (or "patient") may be any applicable human, animal, or other organism, living or dead, or other biological or molecular structure or chemical environment, and may relate to particular components of the subject, for instance specific organs, tissues, or fluids of a subject, may be in a particular location of the subject, referred to herein as an "area of interest" or a "region of interest" (ROI).

We claim:

1. A method for CArtesian sampling with Variable density and Adjustable temporal resolution (CAVA), comprising:
creating a uniformly random sampling pattern on a first grid by creating the first grid as a k-t Cartesian grid with $N_s$ phase-encoding (PE) lines;
starting, from a randomly selected first PE index, $p_s$ (1), advancing an index of a subsequent PE lines $gN_s$, yielding:

$$p_s(i+1) = \langle p_s(i) + gN_s \rangle_{N_s} m;$$

projecting samples from the first grid to a second grid using a nonlinear stretching function;
reconstructing diagnostic quality images from the second grid; and
visually presenting the diagnostic quality images,
wherein $p_s$ (i) is the PE index of the $i^{th}$ i=1, 2, . . . , M sample on the grid with $N_s$ PE lines, g is the golden ratio, and $\langle \cdot \rangle_{N_s}$, which represents modulo operation with modulo $N_s$.

2. An MM apparatus, comprising:
a scanner that generates magnetic fields used for the MR examination;
a measurement space having a patient table; and
a controller having an evaluation module,
wherein the evaluation module executes instructions for performing a method for CArtesian sampling with Variable density and Adjustable temporal resolution (CAVA) that includes:
creating a uniformly random sampling pattern on a first grid;
for each frame, circularly rotating the uniformly random sampling pattern for a previous frame;
repeating the creating and circularly rotating for all frames;
projecting samples from the first grid to a second grid using a nonlinear stretching function;
reconstructing diagnostic quality images from the second grid; and
visually presenting the diagnostic quality images,
wherein the evaluation module creates the uniformly random sampling pattern further comprising creating the first grid as a k-t Cartesian grid with $N_s$ phase-encoding (PE) lines, and
wherein evaluation module further starts, from a randomly selected first PE index, $p_s$ (1), advancing an index of a subsequent PE lines $gN_s$, yielding:

$$p_s(i+1) = \langle p_s(i) + gN_s \rangle_{N_s} m, \text{ and}$$

wherein $p_s$ (i) is the PE index of the $i^{th}$ i=1, 2, . . . , M sample on the grid with $N_s$ PE lines, g is the golden ratio, and $\langle \cdot \rangle_{N_s}$, which represents modulo operation with modulo $N_s$.

3. A method for Golden-shift Ordered Cartesian (GOC) sampling, comprising:
creating a uniformly random sampling pattern on a k-t Cartesian grid with Ns phase-encoding (PE) lines;
circularly rotating the sampling pattern of a previous frame; and
determining if all frames have been completed, and if so, applying a nonlinear stretching operation to create a variable density sampling pattern with N PE lines.

4. A method for CArtesian sampling with Variable density and Adjustable temporal resolution (CAVA), comprising:
creating a uniformly random sampling pattern on a first grid;
projecting samples from the first grid to a second grid using a nonlinear stretching function;
reconstructing diagnostic quality images from the second grid; and
visually presenting the diagnostic quality images,
wherein the projecting yields:

$$p(i) = p_s(t) - k sign\left(\frac{N_x}{2} - p_s(i)\right)\left|\frac{N_x}{2} - p_s(k)\right|^\alpha + \frac{1}{2}(N - N_s), \text{ and}$$

$$P_c(i) = [p(i)].$$

wherein $p_c(i)$ is the PE index of the $i^{th}$ sample on the grid with PE lines, s controls the relative acceleration rate at the center of k-space compared to the overall acceleration rate, with s>1 ensuring that the sampling density is higher at the center of k-space, $\alpha \geq 0$ controls the transition from high-density central region to low-density outer region, [•] represents the rounding operation, and constant k≥0 is selected such samples $p_s=1$ and $p_s=N$ are mapped to p=1 and p=N, respectively.

5. An MM apparatus, comprising:
a scanner that generates magnetic fields used for the MR examination;
a measurement space having a patient table; and
a controller having an evaluation module,
wherein the evaluation module executes instructions for performing a method for CArtesian sampling with Variable density and Adjustable temporal resolution (CAVA) that includes:
creating a uniformly random sampling pattern on a first grid;
for each frame, circularly rotating the uniformly random sampling pattern for a previous frame;
repeating the creating and circularly rotating for all frames;
projecting samples from the first grid to a second grid using a nonlinear stretching function;
reconstructing diagnostic quality images from the second grid; and
visually presenting the diagnostic quality images,
wherein the projecting yields:

$$p(i) = p_s(t) - k sign\left(\frac{N_x}{2} - p_s(i)\right)\left|\frac{N_x}{2} - p_s(k)\right|^\alpha + \frac{1}{2}(N - N_s), \text{ and}$$

$$P_c(i) = [p(i)].$$

wherein $p_c(i)$ is the PE index of the $i^{th}$ sample on the grid with PE lines, s controls the relative acceleration rate at the center of k-space compared to the overall acceleration rate, with s>1 ensuring that the sampling density is higher at the center of k-space, $\alpha \geq 0$ controls the transition from high-density central region to low-density outer region, [•] represents the rounding operation, and constant k≥0 is selected such samples $p_s=1$ and $p_s=N$ are mapped to p=1 and p=N, respectively.

6. The method of claim 1, wherein:

$$N_s = \frac{N}{s} s > 1.$$

7. The method of claim 1, further comprising creating a variable density sampling pattern with N PE lines using the nonlinear stretching operation.

8. The method of claim 7, wherein the variable density sampling pattern has adjustable temporal resolution.

9. The method of claim 1, wherein the projecting yields:

$$p(i) = p_s(i) - k sign\left(\frac{N_x}{2} - p_s(i)\right)\left|\frac{N_x}{2} - p_s(k)\right|^\alpha + \frac{1}{2}(N - N_S), \text{ and}$$

$$P_c(i) = [p(i)],$$

wherein $p_c(i)$ is the PE index of the $i^{th}$ sample on the grid with PE lines, s controls the relative acceleration rate at the center of k-space compared to the overall acceleration rate, with s>1 ensuring that the sampling density is higher at the center of k-space, $\alpha \geq 0$ controls the transition from high-density central region to low-density outer region, [•] represents the rounding operation, and constant k≥0 is selected such samples $p_s=1$ and $p_s=N$ are mapped to p=1 and p=N, respectively.

10. The method of claim 1, further comprising averaging k-space data sampled using CAVA over time to produce a fully sampled k-space.

11. The apparatus of claim 2, wherein:

$$N_s = \frac{N}{s} s > 1.$$

12. The MM apparatus of claim 2, wherein the evaluation module further creates a variable density sampling pattern with N PE lines using the nonlinear stretching operation.

13. The MRI apparatus of claim 12, wherein the variable density sampling pattern has adjustable temporal resolution.

14. The MRI apparatus of claim 2, wherein the projecting yields:

$$p(i) = p_s(i) - k sign\left(\frac{N_x}{2} - p_s(i)\right)\left|\frac{N_x}{2} - p_s(k)\right|^\alpha + \frac{1}{2}(N - N_S), \text{ and}$$

$$P_c(i) = [p(i)],$$

wherein $p_c(i)$ is the PE index of the $i^{th}$ sample on the grid with PE lines, s controls the relative acceleration rate at the center of k-space compared to the overall acceleration rate, with s>1 ensuring that the sampling density is higher at the center of k-space, $\alpha \geq 0$ controls the transition from high-density central region to low-density outer region, [•] represents the rounding operation, and constant k≥0 is selected such samples $p_s=1$ and $p_s=N$ are mapped to p=1 and p=N, respectively.

15. The MRI apparatus of claim 2, wherein the evaluation module further averages k-space data sampled using CAVA over time to produce a fully sampled k-space.

16. The method of GOC sampling of claim 14, wherein creating the uniformly random sampling pattern comprises sampling on a smaller grid with $N_s$ PE lines $$\left(N_s = \frac{N}{s} s > 1\right).$$

17. The method of GOC sampling of claim 14, circularly rotating the sampling pattern of the previous frame comprises starting from a randomly selected first PE index, $p_s(1)$, an index of the subsequent PE lines is sequentially advanced by $gN_s$, with $g=(1+\sqrt{5})/2$.

18. The method of GOC sampling of claim 14, further comprising applying nonlinear stretching to create a sampling pattern that has variable density.

19. The method of claim 4, creating the uniformly random sampling pattern further comprising creating the first grid as a k-t Cartesian grid with $N_s$ phase-encoding (PE) lines.

20. The method of claim 19, wherein:

$$N_s = \frac{N}{s} s > 1.$$

21. The method of claim 4, further comprising creating a variable density sampling pattern with N PE lines using the nonlinear stretching operation.

22. The method of claim 21, wherein the variable density sampling pattern has adjustable temporal resolution.

23. The method of claim 4, further comprising averaging k-space data sampled using CAVA over time to produce a fully sampled k-space.

24. The MRI apparatus of claim 5, wherein the evaluation module creates the uniformly random sampling pattern further comprising creating the first grid as a k-t Cartesian grid with $N_s$ phase-encoding (PE) lines.

25. The apparatus of claim 5, wherein:

$$N_s = \frac{N}{s} s > 1.$$

26. The MRI apparatus of claim 5, wherein the evaluation module further creates a variable density sampling pattern with N PE lines using the nonlinear stretching operation.

27. The MRI apparatus of claim 26, wherein the variable density sampling pattern has adjustable temporal resolution.

28. The MRI apparatus of claim 5, wherein the evaluation module further averages k-space data sampled using CAVA over time to produce a fully sampled k-space.

* * * * *